(12) United States Patent
Chung

(10) Patent No.: US 7,388,796 B2
(45) Date of Patent: Jun. 17, 2008

(54) METHOD FOR TESTING MEMORY UNDER WORSE-THAN-NORMAL CONDITIONS

(75) Inventor: Shine Chung, Taipei Hsien (TW)

(73) Assignee: Taiwan Semiconductor Manufacturing Co., Ltd. (TW)

( * ) Notice: Subject to any disclaimer, the term of this patent is extended or adjusted under 35 U.S.C. 154(b) by 180 days.

(21) Appl. No.: 11/477,311

(22) Filed: Jun. 29, 2006

(65) Prior Publication Data

US 2008/0002489 A1 Jan. 3, 2008

(51) Int. Cl.
*G11C 29/00* (2006.01)

(52) U.S. Cl. .................. 365/201; 365/149; 365/150; 365/191; 365/200

(58) Field of Classification Search .............. 365/201, 365/149, 150, 191, 200
See application file for complete search history.

(56) References Cited

U.S. PATENT DOCUMENTS 5,953,271 A * 9/1999 Ooishi .................... 365/201
6,282,135 B1 * 8/2001 Proebsting ............... 365/203

OTHER PUBLICATIONS

A.J. Van de Goor, et al., "March LR: A Test for Realistic Linked Faults", 14th VLSI Test Symposium, (1996), Delft Univ. of Technology, Dept. of Electrical Engineering, Delft, The Netherlands, pp. 272-280.
A.J. Van de Goor, et al., "Industrial Evaluation of DRAM Tests", (Delft Univ. of Technology, Faculty of Information Technology and Systems, Dept. of Electrical Engineering, Section Computer Architecture and Digital Technique, Delft, The Netherlands, 8 pages.
Masashi Hashimoto, "Over an Order of Magnitude DRAM Test Time Reduction by Charge Offset", IEEE 1996 Custom Integrated Circuits Conference, Texas Instruments Japan, Ltd., pp. 483-486.

* cited by examiner

*Primary Examiner*—Pho M. Luu
(74) *Attorney, Agent, or Firm*—Kirkpatrick & Lockhart Preston Gates Ellis

(57) ABSTRACT

A method for testing a memory with cell plates and bit-line plates comprises putting the memory in a test mode, applying a test pattern to the memory, then providing a first voltage higher than Vdd/2 to the cell plate when writing a '1' to a predetermined cell, providing a second voltage lower than Vdd/2 to the cell plate when writing a '0' to a predetermined cell, wherein the first and second voltages are applied to emulate weak charge storage in the memory cell, similarly, providing a third voltage higher than Vdd/2 to the bit-line plate when expecting to read a '1' from a predetermined cell, and providing a fourth voltage lower than Vdd/2 to the bit-line plate when expecting to read a '0' from a predetermined cell, wherein the third and fourth voltages are applied to emulate charge decay in the memory cell.

17 Claims, 2 Drawing Sheets

METHOD FOR TESTING MEMORY UNDER WORSE-THAN-NORMAL CONDITIONS

BACKGROUND

The present invention relates generally to testing memory devices, and, more particularly, to methods for generating worse-than-normal memory test conditions.

Every memory chip goes through a series of functional tests before being packaged and shipped to a customer. If a faulty chip is assembled on a system board, debugging and dissembling it will be very costly. So screening out all faulty chips before they are shipped is a very important step in manufacturing the memory chips. Besides, as memory chips may operate in worse-than-normal and very noisy field environments, their test conditions should also emulate the field environments to screen out weaker chips.

Conventional DRAM tests comprise a series of write-and-read operations to have every bit of the memory chip being accessed. For example, a March pattern can be shown as following:

$$(w0)\uparrow(r0, w1)\uparrow(r1, w0)\downarrow(r0)$$

where w0 means 'write 0', r0 means 'read 0', and similarly, w1 means 'write 1', r1 means 'read 1'. Symbol '↑' means incrementing addresses, and symbol '↓' means decrementing addresses, referring to Schanstra and A. J. Van De Goor, "Industrial Evaluation of DRAM Tests", Proc. Design, Automation and Test in Europe, 1999, pp. 623-630.

The read-and-write operations inside a pair of parentheses are applied to one byte or one word of cells and the operations step through the whole memory. Here a byte has 8 bits of cells, and a word has 16 bits of cells. Some memory chips may have bandwidths other than 8 or 16 bits. Then '(r0, w1)↑' means first reading a byte or a word, which is supposed to be a '0', if not, then there must be at least one faulty bit in that byte or word, then writing '1' into it.

There are other test patterns with different combinations of write-and-read that can generate different kinds of disturbances to detect fault bits in a DRAM chip. But often these tests operate at just normal disturbance conditions. A worse than normal test condition may require the presence of individual or in combination of following conditions: (1) lowered supply voltage and high temperature, (2) cell data being weakened, the stored charge decayed, (3) stress from accessing neighboring cells at worst. For examples, if a cell stored decayed charges but surrounded by neighboring cells with newly written opposite charge polarity, reading this cell may have high probability noise coupling. Most test patterns do not create this environment and stress, but this condition is valid and can happen in practical memory products.

One of conventional ways of lowering supply voltage (Vdd) to weaken a cell is to directly toggle the Vdd. But Vdd has heavy capacitance load, and switching it normally takes milliseconds in production testers, which makes switching Vdd during every write-and-read cycle impractical.

A DRAM cell weakening method is to insert delay time so that charges stored in DRAM cells are extra decayed, and hence weakened. But this method also increases test time, and are not practical.

What is needed is a test method to align maximum number of worse-than-normal test conditions without increasing test time.

SUMMARY

In view of the foregoing, a method for testing a memory, such as a DRAM, with a plurality of charge storing cells coupled to a plurality of bit-lines and one or more cell plates for biasing the cells and one or more bit-line plates for biasing the bit-lines, is disclosed, the method comprising putting the memory in a test mode, applying a test pattern to the memory, then providing a first voltage higher than one half of a positive supply voltage (Vdd) to the cell plate when writing a '1' to a predetermined cell, providing a second voltage lowered than one half of the Vdd to the cell plate when writing a '0' to a predetermined cell, wherein the first and second voltages are applied to emulate weak charge storage in the memory cell, similarly, providing a third voltage higher than one half of the Vdd to the bit-line plate when expecting to read a '1' from a predetermined cell, and providing a fourth voltage lowered than one half of the Vdd to the bit-line plate when expecting to read a '0' from a predetermined cell, wherein the third and fourth voltages are applied to emulate charge decay in the memory cell.

The construction and method of operation of the invention, however, together with additional objects and advantages thereof will be best understood from the following description of specific embodiments when read in connection with the accompanying drawings.

DESCRIPTION

The present invention has utilized some unique structures of dynamic random access memory (DRAM) to emulate charge decay without increasing test time. So following discussions are focused on DRAM testing. But the present invention can be used in testing other memories with similar features.

Figure 1:
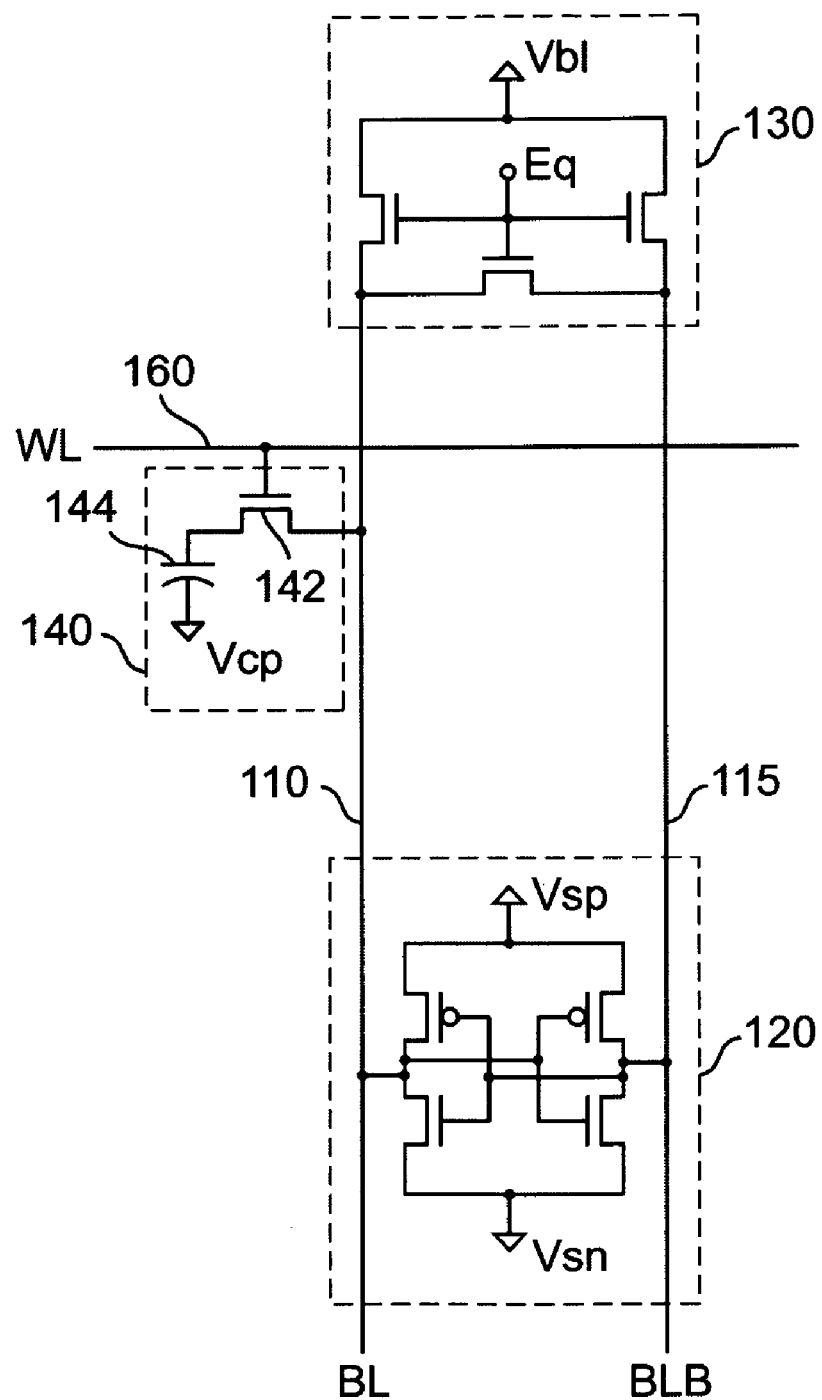
FIG. 1 is a part of a DRAM core showing a pair of bit-lines with a sense amplifier, a bit-line equalizer and an exemplary DRAM cells.

FIG. 1 is a part of a DRAM core showing a pair of bit-lines 110 and 115, with a sense amplifier 120, a bit-line equalizer 130, and a storage cell 140. The storage cell 140 comprises one access transistor 142 which is coupled to a word-line 160, and a storage capacitor 144. When the word-line 160 turns on the access transistor 142, charges stored in the capacitor 144 starts to dump onto the bit-line 110, which causes the bit-lines 110 and 115 to develop a differential voltage, which in turn will be amplified by the sense amplifier 120.

Referring to FIG. 1, Vbl is a bit-line plate voltage, normally set at one half of a positive supply voltage (Vdd). Vcp is a cell plate voltage, normally also set at 0.5*Vdd. A read operation can be summarized in following steps:

(1) Turn off the bit-line equalizer 130 by switching a node EQ to a complementary low voltage supply (Vss), so that all three NMOS transistors in the bit-line equalizer 130 are turned off.

(2) Turn on the word-line 160 to allow charges stored in the cell capacitor 144 to re-distribute to bit-lines 110.

(3) Turn on the sense amplifier 120 by pulling Vsn to the Vss and Vsp to the Vdd. A small voltage split between the bit-lines 110 and 115 will be amplified and restored to full swing at the bit-lines 110 and 115.

Vcp determines the amount of charges that can be stored in a cell. If Vcp is higher than one half of the Vdd, there will be more charges for data '0', and less charges for data '1'. On the other hand, if Vcp is lower than one half of the Vdd, there will be more charges for data '1' and less charges for data '0'. Because of these, in order to test DRAM cell at a worse than normal condition, Vcp can be forced to higher than Vdd, when writing a '1', and forced to lower than Vdd, when writing a '0'. Similarly, Vbl determines the amount of differential voltages developed at bitline and bitline complementary. If Vbl is higher than half Vdd, the bitline differential voltage does not favor a "1" for read. Similarly, if Vbl is lower than half Vdd, the bitline differential voltage does not favor a "0" for read.

Referring to FIG. 1 again, assuming capacitances of the cell capacitor 144 and the bit-line 110 are Cs and Cb, respectively, and Vn is a cell written voltage, equals either Vdd for being written a '1' or Vss for being written a '0'. After word-line 160 turns on-the access transistor 142, a final voltage Vo is reached after charge sharing between the cell capacitor 144 and the bit-line 110, then $$Vo*Cb + (Vo - Vcp)*Cs = Vbl*Cb + (Vn - Vcp)*Cs \quad \text{(Eq. 1)}$$

Or $$Vo = \frac{(Cb*Vbl + Cs*Vn)}{Cb + Cs} \quad \text{(Eq. 2)}$$

So, a voltage difference after the charge sharing is $$\Delta V = Vo - Vbl = \frac{(n - Vbl)*Cs}{Cs + Cb} \quad \text{(Eq. 3)}$$

Or $$\Delta V = \frac{(Vdd - Vbl)*Cs}{Cs + Cb} \text{ for reading '1', when } Vn = Vdd \quad \text{(Eq. 4)}$$

$$\Delta V = \frac{(Vss - Vbl)*Cs}{Cs + Cb} \text{ for reading '0', when } Vn = Vss \quad \text{(Eq. 5)}$$

Referring to Eqs. 4 and 5, in an ideal condition, Vbl is set to 0.5*(Vdd-Vss), or simply 0.5*Vdd, as Vss is normally set to zero volt, so that read '1' and '0' have equal differential voltages for sensing. However, if Vbl is raised to 0.6*Vdd, Eq. 4 becomes $$\Delta V = \frac{0.4*Vdd*Cs}{Cs + Cb}$$

for reading '1', and Eq. 5 becomes $$\Delta V = \frac{0.6*Vdd*Cs}{Cs + Cb}$$

for reading '0'. In another words, when Vbl is raised, reading '1' has less margin than reading '0'.

On the other hand, when Vbl is lowered to 0.4*Vdd, Eq. 4 becomes $$\Delta V = \frac{0.6*Vdd*Cs}{Cs + Cb}$$

for reading '1', and Eq. 5 becomes $$\Delta V = \frac{0.4*Vdd*Cs}{Cs + Cb}$$

for reading '0'. So lowering Vbl provides less margin for reading '0' than reading '1'.

Based on above analysis, in order to test DRAM cells at worse than normal condition, when reading '1', Vbl should be raised, and when reading '0', Vbl should be lowered.

Essentially, toggling either Vcp or Vbl can successfully emulate cell charge decay for read and write respectively without inserting delay time. In most DRAM designs, probe pads are provided for forcing Vcp or Vbl by a tester during a test mode. Since cell plate and bit-line plates have far less capacitance loading than that of the Vdd toggling Vcp and Vbl is feasible as well.

FIG. 1 shows just one word-line and one bit-line pairs, a full DRAM array may have at least 512 rows. If 512 cells are accessed, anywhere up to 256 sense amplifiers may be turned on at any given time, thereby leading to a high level of noise since the mutual couplings between bit-lines of the memory cells can be very significant. This high level of noise can disturb weaker cells.

Figure 2:
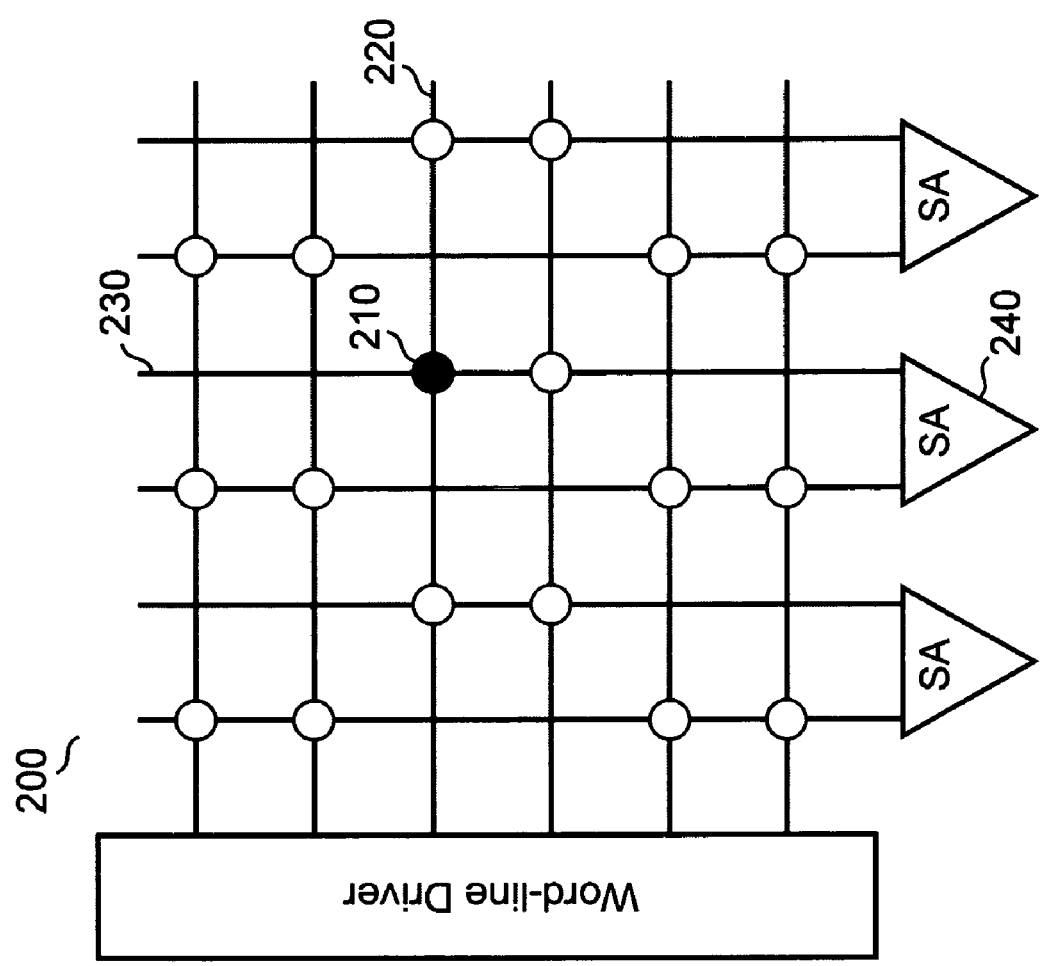
FIG. 2 is a part of a DRAM core array showing just one cell among neighboring cells all with an opposite polarity.

FIG. 2 is a part of a DRAM core array 200 showing just one cell 210 among neighboring cells all with an opposite polarity, and this is the worst case of cell disturbances. A MarchLR test pattern is based on this concept:

(w0)↑(r0, w1)↓(r1, w0, r0, w1)↑(r1, w0)↓(r0, w1, r1, w0)↑(r0)↓ where 'w0' and 'w1' represent writing '0' and '1' to a cell, respectively, 'r0' and 'r1' represent reading '0' and '1' from a cell, respective. A symbol '↑' represents incrementing the address while a symbol '↓' represents decrementing the address. The operation in the first parenthesis writes background '0'. The operations in the second parenthesis read '0' and then write '1' to every cell converting all cells to '1' in the end. The third operations read '1', write '0', and read '0' among the background '1'. The last operation in the third parenthesis restores '1', so that the same disturbance conditions can be applied to the next cells. Note that the write '0' within the third parenthesis and the write '1' within the fifth parenthesis are read-verifying cells that are surrounded by opposite polarities. Referred to A. J. Van De Goor and G. N. Gayadadjiev, "March LR: A Memory Test for Realistic Linked Faults," Proc. IEEE VLSI Test Symposium, pp 272-280, 1996.

When toggling Vcp and Vbl in combination with the MarchRL test pattern. Vcp or Vbl can be toggled just once during an entire chip writing/reading. Such toggling affects write and read margins, respectively, so that such testing method virtually has no test penalty on test time.

While combining aforementioned toggling Vcp and Vbl with the MarchRL test pattern provides the worst case DRAM testing method. Toggling Vbl and Vcp can be used with any other test pattern to emulate a test condition with cell charge decayed.

This invention provides many different embodiments, or examples, for implementing different features of the invention. Specific examples of components and methods are described to help clarify the disclosure. These are, of course, merely examples and are not intended to limit the disclosure from that described in the claims.

What is claimed is:

1. A method for testing at least one memory with a plurality of charge storing cells coupled to a plurality of bit-lines and one or more cell plates for biasing the cells and one or more bit-line plates for biasing the bit-lines, the method comprising:
   putting the memory in a test mode;
   applying a test pattern to the memory;
   providing a first voltage higher than one half of a positive supply voltage (Vdd) to the cell plate when writing a '1' to a predetermined cell; and
   providing a second voltage lower than one half of the Vdd to the cell plate when writing a '0' to a predetermined cell,
   wherein the first and second voltages are applied to emulate weak charge storage in the memory cell.

2. The method of claim 1, wherein the applying further comprises applying a March test pattern.

3. The method of claim 1, wherein the providing the first or second voltage further comprises providing the cell plate with a certain voltage level during an entire period when writing all '1s' or all '0s' to all the predetermined cells.

4. The method of claim 1 further comprising:
   providing a third voltage higher than one half of the Vdd to the bit-line plate when expecting to read a '1' from a predetermined cell; and
   providing a fourth voltage lower than one half of the Vdd to the bit-line plate when expecting to read a '0' from a predetermined cell,
   wherein the third and fourth voltages are applied to emulate charge decay in the memory cell.

5. The method of claim 4, wherein the providing the third or fourth voltage further comprises providing the bit-line plate with a certain voltage level during an entire period when expecting to read all '1s' or all '0s' from all the predetermined cells.

6. The method of claim 1, wherein the memory is a dynamic random access memory (DRAM).

7. A method for testing at least one memory with a plurality of charge storing cells coupled to a plurality of bit-lines and one or more cell plate for biasing the cells and one or more bit-line plate for biasing the bit-lines, the method comprising:
   putting the memory in a test mode;
   applying a test pattern to the memory;
   providing a first voltage higher than one half of a positive supply voltage (Vdd) to the bit-line plate when expecting to read a '1' from a predetermined cell; and
   providing a second voltage lower than one half of the Vdd to the bit-line plate when expecting to read a '0' from a predetermined cell,
   wherein the first and second voltages are applied to emulate charge decay in the memory cell.

8. The method of claim 7, wherein the applying further comprises applying a March test pattern.

9. The method of claim 7, wherein the providing the first or second voltage further comprises providing the bit-line plate with a certain voltage level during an entire period when expecting to read all '1s' or all '0s' from all the predetermined cells.

10. The method of claim 7 further comprising:
    providing a third voltage higher than one half of the Vdd to the cell plate when writing a '1' to a predetermined cell; and
    providing a fourth voltage lower than one half of the Vdd to the cell plate when writing a '0' to a predetermined cell,
    wherein the third and fourth voltages are applied to emulate charge decay in the memory cell.

11. The method of claim 10, wherein the providing the third or fourth voltage further comprises providing the cell plate with a certain voltage level during an entire period when writing all '1s' or all '0s' to all the predetermined cells.

12. The method of claim 7, wherein the memory is a dynamic random access memory (DRAM).

13. A method for testing at least one memory with a plurality of charge storing cells coupled to a plurality of bit-lines and one or more cell plates for biasing the cells and one or more bit-line plate for biasing the bit-lines, the method comprising:
    putting the memory in a test mode;
    applying a test pattern to the memory;
    providing a first voltage higher than one half of a positive supply voltage (Vdd) to the cell plate when writing a '1' to a predetermined cell;
    providing a second voltage lower than one half of the Vdd to the cell plate when writing a '0' to a predetermined cell;
    providing a third voltage higher than one half of the Vdd to the bit-line plate when expecting to read a '1' from a predetermined cell; and
    providing a fourth voltage lower than one half of the Vdd to the bit-line plate when expecting to read a '0' from a predetermined cell,
    wherein the first and second voltages are applied to emulate weak charge storage in the memory cell, and the third and fourth voltages are applied to emulate charge decay in the memory cell.

14. The method of claim 13, wherein the applying further comprises applying a March test pattern.

15. The method of claim 13, wherein the providing the first or second voltage further comprises providing the cell plate with a certain voltage level during an entire period when writing all '1s' or all '0s' to all the predetermined cells.

16. The method of claim 13, wherein the providing the third or fourth voltage further comprises providing the bit-line plate with a certain voltage level during an entire period when expecting to read all '1s' or all '0s' from all the predetermined cells.

17. The method of claim 13, wherein the memory is a dynamic random access memory (DRAM).

* * * * *